US 12,334,947 B2

United States Patent
Hiraki et al.

(10) Patent No.: US 12,334,947 B2
(45) Date of Patent: Jun. 17, 2025

(54) SIGNAL PROCESSING DEVICE AND CONTROL METHOD FOR SIGNAL PROCESSING DEVICE

(71) Applicant: HITACHI ASTEMO, LTD., Hitachinaka (JP)

(72) Inventors: Nagamori Hiraki, Hitachinaka (JP); Tomonobu Koseki, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 133 days.

(21) Appl. No.: 18/040,809

(22) PCT Filed: Jun. 29, 2021

(86) PCT No.: PCT/JP2021/024511
§ 371 (c)(1),
(2) Date: Feb. 6, 2023

(87) PCT Pub. No.: WO2022/097327
PCT Pub. Date: May 12, 2022

(65) Prior Publication Data
US 2023/0308109 A1    Sep. 28, 2023

(30) Foreign Application Priority Data
Nov. 9, 2020  (JP) ................. 2020-186567

(51) Int. Cl.
*H03M 1/12*    (2006.01)
*H03M 1/06*    (2006.01)
*H03M 1/64*    (2006.01)

(52) U.S. Cl.
CPC ....... *H03M 1/1255* (2013.01); *H03M 1/0626* (2013.01); *H03M 1/64* (2013.01)

(58) Field of Classification Search
CPC ..... H03M 1/64; H03M 1/0626; H03M 1/1255
See application file for complete search history.

(56) References Cited

U.S. PATENT DOCUMENTS 5,581,254 A * 12/1996 Rundel ............... G05B 19/19
                                                    341/122
8,604,962 B1 * 12/2013 Lewyn ............... H03M 1/0863
                                                    341/161
(Continued)

FOREIGN PATENT DOCUMENTS

JP    2001-223586 A    8/2001
JP    2001-264114 A    9/2001
(Continued)

OTHER PUBLICATIONS

International Preliminary Report on Patentability and Written Opinion dated May 19, 2023 issued in International Application No. PCT/JP2021/024511, with English translation, 13 pages.
(Continued)

*Primary Examiner* — Lam T Mai
(74) *Attorney, Agent, or Firm* — FOLEY & LARDNER LLP

(57) ABSTRACT

A signal processing device and a control method therefor comprise: a filter circuit including a first capacitor and reducing a predetermined frequency component of an analog signal; a sample-and-hold circuit including a second capacitor and sampling and holding the analog signal that has passed through the filter circuit; and an AD conversion circuit converting an output signal from the sample-and-hold circuit into a digital signal, and a predetermined voltage is applied to the second capacitor, thereby charging the second capacitor, and the sample-and-hold circuit is then caused to sample the analog signal that has passed through the filter circuit. This suppresses the time required to charge the first capacitor and reduces errors in digital signals.

4 Claims, 4 Drawing Sheets

(56) References Cited

U.S. PATENT DOCUMENTS

| | | | |
|---|---|---|---|
| 10,574,258 B1* | 2/2020 | Albel | H02M 7/53871 |
| 2008/0094981 A1* | 4/2008 | Ota | G11B 7/1263 |
| | | | 369/53.26 |
| 2010/0007294 A1* | 1/2010 | Hasegawa | G01D 5/2451 |
| | | | 318/400.04 |
| 2011/0037628 A1* | 2/2011 | Petrovic | H03M 1/1038 |
| | | | 341/120 |
| 2011/0074612 A1* | 3/2011 | Ariyoshi | H03M 1/1076 |
| | | | 341/122 |
| 2015/0077320 A1* | 3/2015 | Sato | G01J 3/513 |
| | | | 341/172 |
| 2015/0372606 A1* | 12/2015 | Tamura | H02M 3/33584 |
| | | | 363/21.04 |
| 2019/0162869 A1* | 5/2019 | Takahashi | G11C 27/02 |
| 2020/0083794 A1* | 3/2020 | Bhandarkar | H02M 3/157 |
| 2023/0370083 A1* | 11/2023 | Obata | H03M 1/0854 |

FOREIGN PATENT DOCUMENTS

| | | |
|---|---|---|
| JP | 2011-077847 A | 4/2011 |
| JP | 2012-194193 A | 10/2012 |
| JP | 2013-502158 A | 1/2013 |

OTHER PUBLICATIONS

International Search Report dated Aug. 3, 2021 issued in International Application No. PCT/JP2021/024511, with English translation, 4 pages.

* cited by examiner

SIGNAL PROCESSING DEVICE AND CONTROL METHOD FOR SIGNAL PROCESSING DEVICE

TECHNICAL FIELD

The present invention relates to a signal processing device and to a control method for a signal processing device.

BACKGROUND ART

The angle detection device disclosed in Patent Document 1, in obtaining, using a vector expressed by the outputs of at least one pair of Hall elements arranged orthogonally to each other, the rotation angle of the Hall elements relative to the magnetic field, switches the driving direction of the Hall elements at predetermined frequency and switches the outputs of the two pairs of Hall elements at predetermined frequency and retrieves them; acquires the output signals from each pair of Hall elements by inverting the sign of the acquired signals at predetermined frequency; applies ΔΣ modulation to the acquired signals through a ΔΣ modulator; and retrieves angle data obtained by removing various offsets from the ΔΣ modulated signals, through a phase locked loop circuit.

REFERENCE DOCUMENT LIST

Patent Document

Patent Document 1: JP2012-194193 A

SUMMARY OF THE INVENTION

Problem to be Solved by the Invention

For example, when converting a sine wave signal output from a rotation angle sensor including a Hall element or the like into a digital signal for arithmetic processing, a signal processing device may be used that includes a filter circuit to remove high-frequency components from the sine wave signal, a sample-and-hold circuit used to sample and hold the signal that has passed through the filter circuit, and an AD conversion circuit used to AD-convert the output signal from the sample-and-hold circuit can be used.

In this signal processing device, reducing the capacitance of capacitor C1 that constitutes the filter circuit reduces the phase delay of the signal and enables angle detection in a high-speed rotating state.

However, if the capacitance of capacitor C1 is reduced, after the sample-and-hold circuit samples 0 V, that is, if the sensor signal is sampled after the charges of capacitor C2 constituting the sample-and-hold circuit have been emptied, the charges are shared between capacitor C1 of the filter circuit and capacitor C2 of the sample-and-hold circuit.

Accordingly, the charge time of capacitor C1, which constitutes the filter circuit, becomes longer, and the output voltage of the filter circuit reaches the input voltage with a delay by the charge time.

If the sample-and-hold circuit samples a voltage while capacitor C1 is being charged, that is, when the output voltage of the filter circuit has not reached the input voltage, the AD conversion results in a larger error in the digital signal.

An object of the present invention, which has been made in view of the existing circumstances, is to provide a signal processing device and a control method for the signal processing device, which can reduce errors in digital signals by suppressing the time required to charge a capacitor C1 constituting a filter circuit.

Means for Solving the Problem

A signal processing device of one aspect of the present invention includes: a filter circuit including a first capacitor and reducing a predetermined frequency component of an analog signal; a sample-and-hold circuit including a second capacitor and sampling and holding the analog signal that has passed through the filter circuit; an AD conversion circuit converting an output signal from the sample-and-hold circuit into a digital signal; a voltage application circuit applying a predetermined voltage to the second capacitor; and a control unit applying the predetermined voltage to the second capacitor through the voltage application circuit, thereby charging the second capacitor, and then causing the sample-and-hold circuit to sample the analog signal that has passed through the filter circuit.

A control method for a signal processing device of one aspect of the present invention is a control method for a signal processing device including: a filter circuit including a first capacitor and reducing a predetermined frequency component of a sinusoidal analog signal; a sample-and-hold circuit including a second capacitor and sampling and holding the analog signal that has passed through the filter circuit; and an AD conversion circuit converting an output signal from the sample-and-hold circuit into a digital signal, the method comprising the steps of: charging the second capacitor by applying a voltage of ½ of the reference voltage of the AD conversion circuit to the second capacitor; and causing the sample-and-hold circuit to sample the analog signal that has passed through the filter circuit.

Effects of the Invention

According to the present invention, errors in digital signals can be suppressed by reducing the time required to charge a capacitor constituting a filter circuit.

MODE FOR CARRYING OUT THE INVENTION

The following is a description of an embodiment of a signal processing device and a control method for the signal processing device with reference to the accompanying drawings.

In the embodiment shown below, the signal processing device is used to process the sinusoidal analog signals output from a rotation angle sensor.

The rotation angle sensor is a sensor that detects the rotation angle of the rotor (i.e., the rotating body) of a brushless motor that generates steering force in an electric power steering system of a car, for example.

Figure 1:
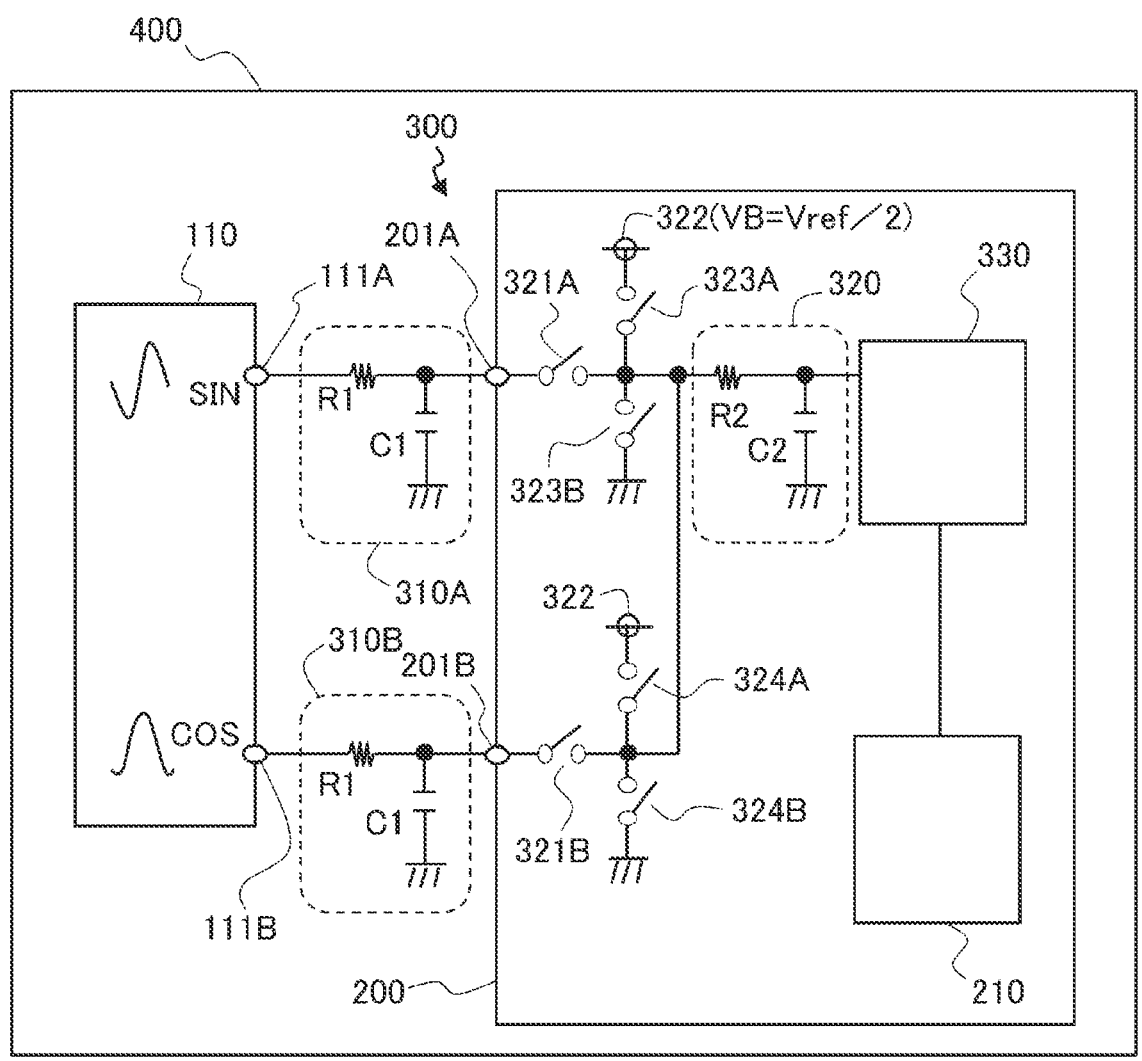
FIG. 1 is a circuit diagram of a signal processing device.

FIG. 1 is a circuit diagram showing one aspect of the signal processing device.

A motor control device 400 is an electronic control device including a microcomputer 200. Microcomputer 200 includes an arithmetic processing device 210 such as a microprocessor unit (MPU).

Motor control device 400 also includes a rotation angle sensor 110 and a signal processing device 300 that processes the output signals from rotation angle sensor 110 and outputs them to arithmetic processing device 210.

Rotation angle sensor 110 is a rotation angle sensor, such as a Hall IC, that detects the angle of the rotor of a brushless motor (not shown in the drawings), which has a permanent magnet and is integrated with the shaft.

Here, motor control device 400 is installed together with the brushless motor, and the circuit board including motor control device 400 is mounted with an arithmetic processing device 210, a rotation angle sensor 110, and a signal processing device 300. Rotation angle sensor 110 is positioned on the board so that it faces the permanent magnet of the rotor.

Microcomputer 200 calculates the rotor angle of the brushless motor based on the output signal from rotation angle sensor 110 and controls the energization of each winding of the brushless motor based on the calculated rotor angle.

Rotation angle sensor 110 outputs sine wave signals SIN and cosine wave signals COS, which are sinusoidal analog signals, according to the rotation angle of the brushless motor.

Figure 2:
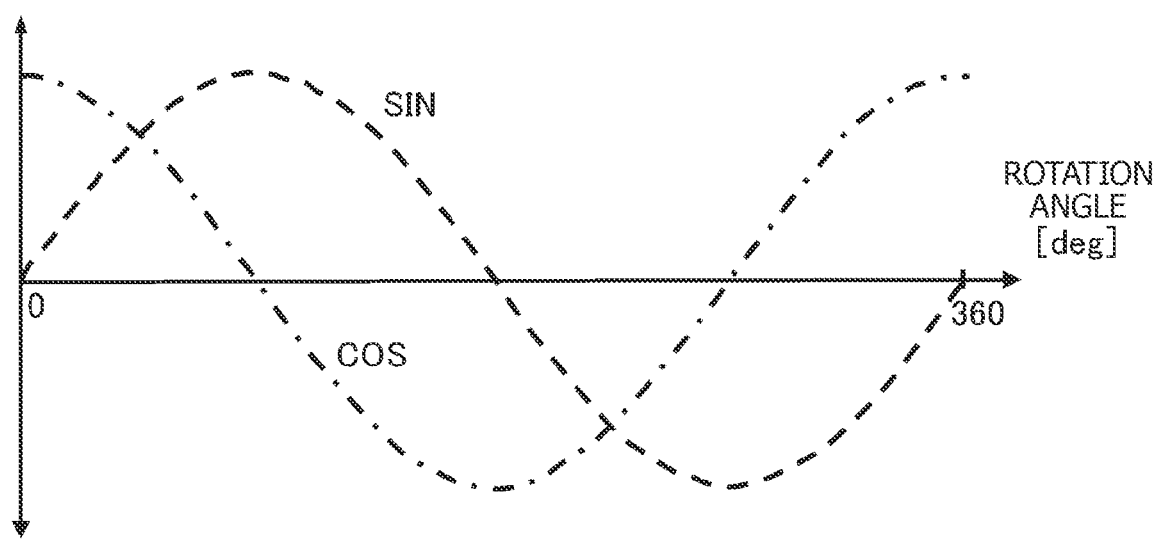
FIG. 2 is a waveform diagram showing a sine wave signal SIN and a cosine wave signal COS.

FIG. 2 shows the waveforms of the sine wave signal SIN and the cosine wave signal COS.

The sine wave signal SIN and cosine wave signal COS are analog signals which change in voltage in a sinusoidal form and are 90 deg out of phase with each other.

Arithmetic processing device 210 of microcomputer 200 retrieves the sine wave signal SIN and cosine wave signal COS, and performs an arctan (sin/cos) calculation to obtain the absolute angle of the rotor of the brushless motor.

The sine wave signal SIN and cosine wave signal COS output from rotation angle sensor 110 are processed by signal processing device 300 and converted into digital signals, and then taken into arithmetic processing device 210.

Signal processing device 300 includes low-pass filter circuits 310A and 310B, sample-and-hold circuit 320, and AD conversion circuit 330.

Note that sample-and-hold circuit 320 and AD conversion circuit 330 are integrated into the package of microcomputer 200, and low-pass filter circuits 310A and 310B are provided outside the package of microcomputer 200.

Low-pass filter circuits 310A and 310B are primary low-pass filters including a resistor R1 in series with the input signal, and a capacitor C1 in parallel with the input signal.

Low-pass filter circuit 310A is connected to the output terminal 111A of the sine wave signal SIN of rotation angle sensor 110 and removes high-frequency components (i.e., noise components) from the sine wave signal SIN.

Low-pass filter circuit 310B is connected to the output terminal 111B of the cosine wave signal COS of rotation angle sensor 110 and removes high-frequency components from the cosine wave signal COS.

Thus, low-pass filter circuits 310A and 310B are one aspect of the filter circuit that reduces the predetermined frequency component of the sinusoidal analog signal.

Sample-and-hold circuit 320 is disposed in a stage following the low-pass filter circuits 310A and 310B, and separately samples and holds the sine wave signal SIN and cosine wave signal COS that have passed through low-pass filter circuits 310A and 310B, that is, the sine wave signal SIN and the cosine wave signal COS from which high frequency components have been removed.

Microcomputer 200 includes an input terminal 201A used to retrieve the sine wave signal SIN that has passed through low-pass filter circuit 310A, and an input terminal 201B used to retrieve the cosine wave signal COS that has passed through low-pass filter circuit 310B.

Sample-and-hold circuit 320 includes a resistor R2 connected in series with the input signal, a capacitor C2 connected in parallel with the input signal, a switch 321A provided in the line connecting input terminal 201A and resistor R2 together, and a switch 321B provided in the line connecting input terminal 201B and resistor R2 together.

Both switches 321A and 321B described above are connected in parallel. Switch 321A is used to sample and hold the sine wave signal SIN, and switch 321B is used to sample and hold the cosine wave signal COS.

In the sample mode (i.e., sampling phase) with switch 321A turned on, a charge equivalent to the voltage of the sine wave signal SIN is stored in capacitor C2.

In the subsequent hold mode (i.e., hold phase) in which switch 321A is turned off, a state in which a charge equivalent to the voltage of the sine wave signal SIN immediately before it was turned off is stored in capacitor C2 continues, and the voltage equivalent to the voltage of the sine wave signal SIN continues to be output from sample-and-hold circuit 320.

Similarly, in the sample mode (i.e., sampling phase) in which switch 321B is turned on, a charge equivalent to the voltage of the cosine wave signal COS is stored in capacitor C2.

In the subsequent hold mode (i.e., hold phase) in which switch 321B is turned off, a state in which a charge equivalent to the voltage of the cosine wave signal COS immediately before it was turned off is stored in capacitor C2 continues, and the voltage equivalent to the voltage of the cosine wave signal COS continues to be output from sample-and-hold circuit 320.

Thus, switch 321A and switch 321B are used to switch sample-and-hold circuit 320 between the sample mode and hold mode.

The output signal of sample-and-hold circuit 320 is retrieved by AD conversion circuit 330.

AD conversion circuit 330, which is a circuit that converts analog signals of a voltage of 0 V to the reference voltage Vref into digital signals, converts the output signals from sample-and-hold circuit 320 into digital signals that can be retrieved by arithmetic processing device 210.

Here, the sine wave signal SIN and cosine wave signal COS output from rotation angle sensor 110 are sinusoidal analog signals with a difference of 3.3 V between the minimum and maximum values (see FIG. 2).

Accordingly, in signal processing device 300 that processes the output signal of rotation angle sensor 110, the reference voltage Vref of AD conversion circuit 330 is set to 3.3 V.

Microcomputer 200 controls the turning on and off of switches 321A and 321B, causing sample-and-hold circuit 320 to sample and hold the sine wave signal SIN and cosine wave signal COS to acquire data on the sine wave signal SIN and cosine wave signal COS from AD conversion circuit 330.

Microcomputer 200 then calculates the absolute angle of the rotor of the brushless motor based on the sine wave signal SIN and cosine wave signal COS data, and controls the energization of each winding of the brushless motor based on the calculated absolute angle of the rotor.

In sample-and-hold circuit 320, a switch 323A is provided on the line that connects power supply 322 and a point between switch 321A and resistor R2, and a switch 323B is provided on the line that connects the ground GND and a point between switch 321A and resistor R2.

Similarly, a switch 324A is provided on the line that connects power supply 322 and a point between switch 321B and resistor R2, and a switch 324B is provided on the line that connects the ground GND and a point between switch 321B and resistor R2.

In other words, switch 323A is connected in parallel with switch 321A, switch 324A is connected in parallel with switch 321B, and switch 323A controls the electrical connection between power supply 322 and capacitor C2. Similarly, switch 324A controls the electrical connection between power supply 322 and capacitor C2.

When switch 323A or switch 324A is turned on, the output voltage VB of power supply 322 is applied to capacitor C2, and a charge equivalent to the output voltage VB of power supply 322 is stored in capacitor C2.

In other words, switch 323A, switch 324A, and power supply 322 constitute a voltage application circuit that applies a predetermined voltage to capacitor C2.

On the other hand, when switch 323B or switch 324B is turned on, capacitor C2 serves as a power supply so that current flows through resistor R2, and capacitor C2 is discharged.

Here, microcomputer 200 is used to control the aforementioned switches 323A, 324A, and 323B, and switch 324B to control the charge of capacitor C2 to the default charge, and at this time, performs self-diagnosis about whether or not there is abnormality in AD conversion circuit 330 based on the data acquired from AD conversion circuit 330.

In addition, microcomputer 200 has the function of controlling switch 323A and switch 324A to suppress errors in the AD conversion of the sine wave signal SIN and cosine wave signal COS.

When microcomputer 200 controls switch 323A and switch 324A to suppress AD conversion errors, the output voltage VB of power supply 322 is set to ½ of the reference voltage Vref of AD conversion circuit 330, that is, the output voltage VB=1.65V when the reference voltage Vref=3.3V.

In other words, the output voltage VB of power supply 322, that is, the predetermined voltage applied to capacitor C2 is set to the average value of one cycle of the sine wave signal SIN and cosine wave signal COS, that is, 1.65 V, which is the center value of the amplitude.

In the aforementioned signal processing device 300, the capacitors C1 of low-pass filter circuits 310A and 310B are set as small as possible to suppress the signal phase delay caused by low-pass filter processing.

In this case, when the sensor signal (sine wave signal SIN or cosine wave signal COS) is sampled after the charge of capacitor C2 is emptied by a sample of 0 V, capacitor C1 in low-pass filter circuit 310A or low-pass filter circuit 310B and capacitor C2 in sample-and-hold circuit 320 will share the charge (charge sharing).

The charge sharing makes the charge time of capacitors C1 of low-pass filter circuits 310A and 310B longer, so that the output voltage of low-pass filter circuits 310A and 310B reaches the input voltage with a delay by the charge time.

The charge delay of capacitor C1, that is, the phase delay of the signal due to low-pass filter processing will ultimately increase the error in the AD conversion output.

For this reason, in order to suppress the AD conversion output error from increasing due to the aforementioned charge sharing, microcomputer 200 causes sample-and-hold circuit 320 to sample a voltage of ½ of the AD conversion reference voltage Vref, that is, stores a charge equivalent to 1.65 V in capacitor C2, and then causes sample-and-hold circuit 320 to sample the sine wave signal SIN and the cosine wave signal COS.

In other words, microcomputer 200 has a function as a control unit that applies a predetermined voltage to capacitor C2 to charge capacitor C2, and then causes sample-and-hold circuit 320 to sample the sine wave signal SIN or cosine wave signal COS that has passed through low-pass filter circuit 310A or low-pass filter circuit 310B.

The control function of microcomputer 200 cancels the capacitance to be charge-shared between capacitor C1 of low-pass filter circuit 310A or low-pass filter circuit 310B and capacitor C2 of sample-and-hold circuit 320.

Consequently, the charge time of capacitor C1 is suppressed, so that the phase delay of the output signal from low-pass filter circuits 310A and 310B is suppressed, resulting in a reduction in the AD conversion output errors.

In addition, the output voltage VB of power supply 322 is matched to 1.65 V, which is the average value of one cycle of the sine wave signal SIN and the cosine wave signal COS (i.e., the center value of the amplitude), so that when the output voltage VB is sampled by sample-and-hold circuit 320 before the sensor signal is sampled, the sine wave signal SIN and cosine wave signal COS will approach 1.65 V in the same ratio, thereby reducing the detection error of the rotor angle caused by sampling the output voltage VB (VB=1.65 V).

In addition, switches 323A and 324A for use in diagnosis of the AD conversion function can be diverted to reduce errors in the AD conversion output, thus preventing the circuit configuration from becoming more complex.

Figure 3:
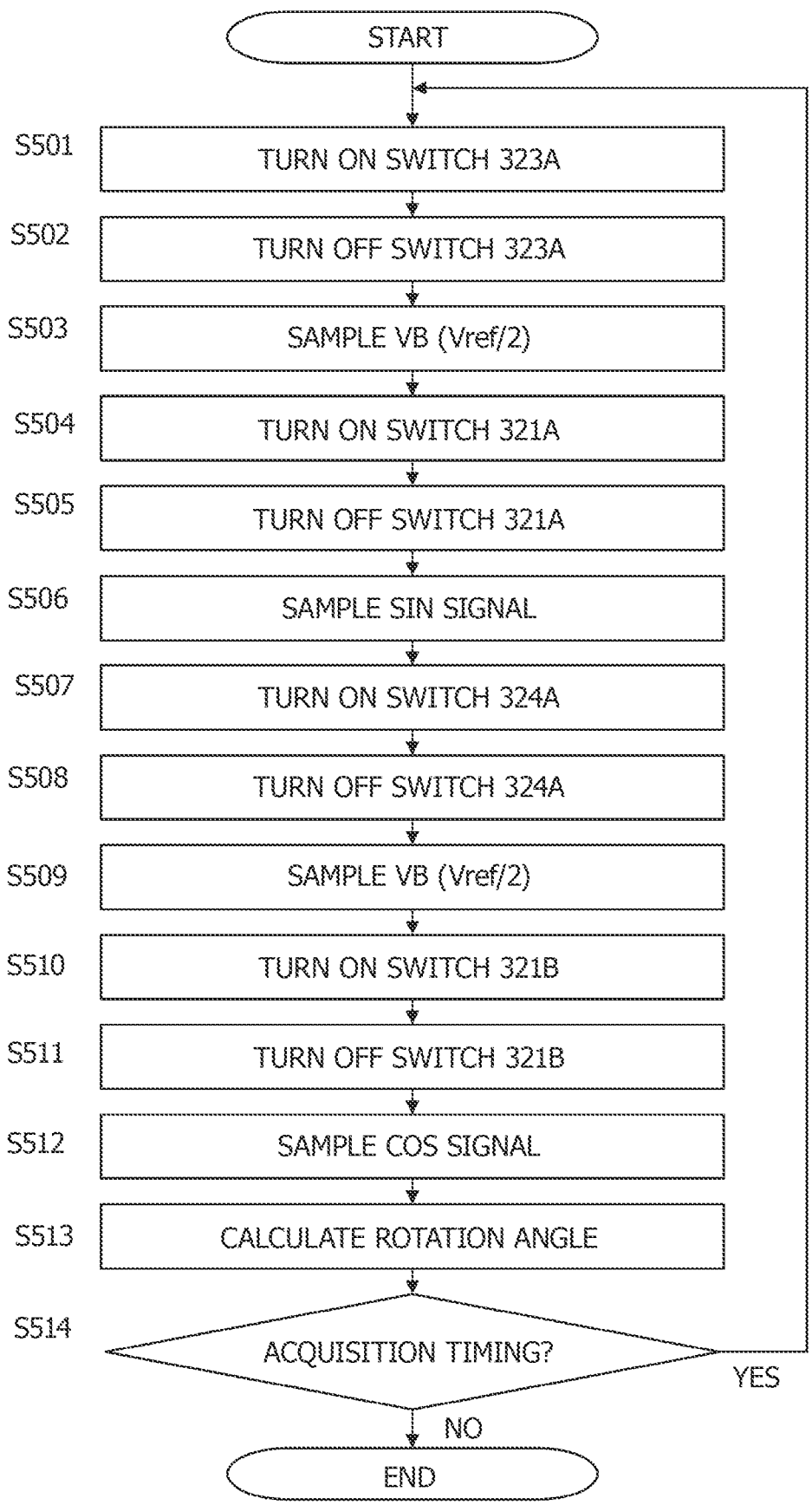
FIG. 3 is a flowchart showing the step of retrieving digital signals.

FIG. 3 is a flowchart of the step of retrieving data of the sine wave signal SIN and cosine wave signal COS performed by microcomputer 200.

In Step S501, microcomputer 200 switches switch 323A to on from off, and capacitor C2 is charged equivalent to the output voltage VB of power supply 322 (VB=Vref/2=1.65 V).

Next, in Step S502, microcomputer 200 switches switch 323A to off from on and causes a signal equivalent to the output voltage VB of power supply 322 to be output from sample-and-hold circuit 320.

Subsequently, in Step S503, microcomputer 200 retrieves output data from AD conversion circuit 330 that AD-converts the output signal from sample-and-hold circuit 320, that is, a digital signal indicating the output voltage VB of power supply 322.

Afterwards, in Step S504, microcomputer 200 switches switch 321A to on from off and charges capacitor C2 equivalent to the voltage of the sine wave signal SIN at that time (i.e., the voltage of the signal that has passed through low-pass filter circuit 310A).

Next, in Step S505, microcomputer 200 switches switch 321A to off from on and causes a signal equivalent to the voltage of the sine wave signal SIN to be output from sample-and-hold circuit 320.

Subsequently, in Step S506, microcomputer 200 retrieves output data from AD conversion circuit 330 that AD-converts the output signal from sample-and-hold circuit 320, that is, a digital signal indicating the voltage of the sine wave signal SIN.

In this way, microcomputer 200 charges capacitor C2 equivalent to the output voltage VB (VB=Vref/2=1.65 V) of power supply 322, that is, causes sample-and-hold circuit 320 to sample the output voltage VB, and then causes sample-and-hold circuit 320 to sample the sine wave signal SIN.

Similar to the aforementioned retrieval of the sine wave signal SIN, microcomputer 200 performs retrieval of the cosine wave signal COS in Steps S507 to S512.

In Step S507, microcomputer 200 switches switch 324A to on from off, and charges capacitor C2 equivalent to the output voltage VB (VB=Vref/2=1.65 V) of power supply 322.

Next, in Step S508, microcomputer 200 switches switch 324A to off from on and causes a signal equivalent to the output voltage VB of power supply 322 to be output from sample-and-hold circuit 320.

Subsequently, in Step S509, microcomputer 200 retrieves output data from AD conversion circuit 330 that AD-converts the output signal from sample-and-hold circuit 320, that is, a digital signal indicating the output voltage VB of power supply 322.

Afterwards, in Step S510, microcomputer 200 switches switch 321B to on from off, and charges capacitor C2 equivalent to the voltage of the cosine wave signal COS at the time (i.e., the voltage of the signal that has passed through low-pass filter circuit 310B).

Next, in Step S511, microcomputer 200 switches switch 321B to off from on and causes a signal equivalent to the voltage of the cosine wave signal COS to be output from sample-and-hold circuit 320.

Subsequently, in Step S512, microcomputer 200 retrieves output data from AD conversion circuit 330 that AD-converts the output signal from sample-and-hold circuit 320, that is, a digital signal indicating the voltage of the cosine wave signal COS.

In this way, microcomputer 200 retrieves data of the sine wave signal SIN and cosine wave signal COS, that is, a digital signal indicating the instantaneous values of the sine wave signal SIN and cosine wave signal COS, and then proceeds to Step S513.

In Step S513, microcomputer 200 calculates the rotation angle (specifically the absolute angle) of the rotor of the brushless motor based on the data of the sine wave signal SIN and cosine wave signal COS that has been retrieved during the processing of Steps S501 to S512.

Here, microcomputer 200 controls the energization of each winding of the brushless motor based on the calculated rotor rotation angle.

Next, microcomputer 200 proceeds to Step S514 to determine the timing for acquiring the rotor rotation angle, that is, whether or not it is the sampling timing for the sine wave signal SIN and cosine wave signal COS.

When it is time to acquire the rotor rotation angle (i.e., calculation timing), microcomputer 200 returns to Step S501, and when it is not time to acquire the rotor rotation angle, this routine is terminated.

Figure 4:
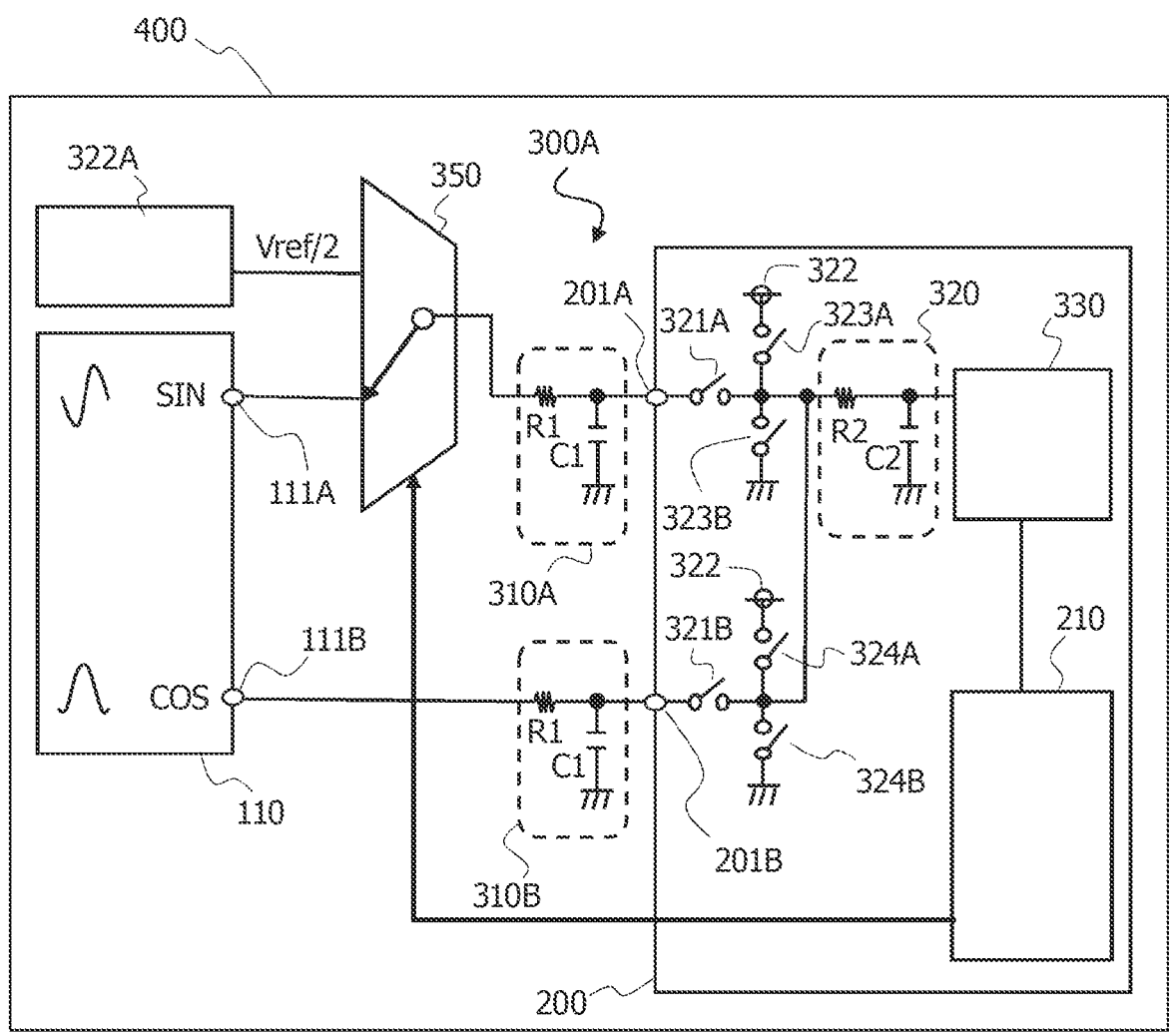
FIG. 4 is a circuit diagram showing another aspect of the signal processing device.

FIG. 4 shows another aspect of a voltage application circuit that applies a predetermined voltage to capacitor C2 of sample-and-hold circuit 320.

Signal processing device 300A in FIG. 4 includes, as a voltage application circuit, a multiplexer 350 serving as a signal selection circuit that switches an input signal from low-pass filter circuit 310A to either the sine wave signal SIN or the supply voltage signal from power supply 322A for which the output voltage VB is set to ½ of the reference voltage Vref.

In signal processing device 300A shown in FIG. 4, switches 323A, 323B, 324A, and 324B are used for diagnosis of AD conversion, so the output voltage VB of power supply 322 should not necessarily be ½ of the reference voltage Vref, and it can be any voltage.

A retrieval step for sampling the sine wave signal SIN will be briefly explained below in signal processing device 300A including aforementioned multiplexer 350.

Before sampling the sine wave signal SIN, microcomputer 200 controls multiplexer 350 to change the input signal of low-pass filter circuit 310A to the supply voltage signal, and in this state, switches switch 321A to on from off.

In this state, a predetermined voltage (predetermined voltage=Vref/2) is applied to capacitor C2 of sample-and-hold circuit 320, and capacitor C2 is charged equivalent to the predetermined voltage=Vref/2.

In other words, the step of changing the input signal of low-pass filter circuit 310A to the supply voltage signal and switching switch 321A to on from off is the step of applying a predetermined voltage=Vref/2 to capacitor C2 and charging capacitor C2.

Microcomputer 200 then switches switch 321A to off from on and retrieves the voltage data of the supply voltage signal output from AD conversion circuit 330.

Next, microcomputer 200 controls multiplexer 350 to change the input signal of low-pass filter circuit 310A to the sine wave signal SIN, and in this state, switches switch 321A to on from off, causing the charge of capacitor C2 to follow a value dependent on the voltage of the sine wave signal SIN.

Next, microcomputer 200 switches switch 321A to off from on and retrieves the voltage data of the sine wave signal SIN output from AD conversion circuit 330.

In other words, the step of changing the input signal of low-pass filter circuit 310A to the sine wave signal SIN and changing switch 321A to on from off after the step of charging capacitor C2 by applying a predetermined voltage=Vref/2 to capacitor C2 is the step of causing sample-and-hold circuit 320 to sample the analog signal that has passed through low-pass filter circuit 310A.

On the other hand, when sampling the cosine wave signal COS, microcomputer 200 first controls multiplexer 350 to change the input signal of low-pass filter circuit 310A to the supply voltage signal, and in this state, switches switch 321A to on from off and charge capacitor C2 equivalent to the predetermined voltage=Vref/2.

Microcomputer 200 then switches switch 321A to off from on and retrieves the voltage data of the supply voltage signal output from AD conversion circuit 330.

Next, microcomputer 200 switches switch 321B to on from off to cause the charge of capacitor C2 to follow a value dependent on the voltage of the cosine wave signal COS.

Next, microcomputer 200 switches switch 321B to off from on and retrieves the voltage data of the cosine wave signal COS output from AD conversion circuit 330.

Signal processing device 300A shown in FIG. 4 has the same acts and effects as signal processing device 300 shown in FIG. 1.

Furthermore, in signal processing device 300A shown in FIG. 4, AD errors can be reduced even if microcomputer 200 does not include a charge and discharge circuit including switches 323A, 323B, 324A, and 324B, which are used for diagnosis of AD conversion, for capacitor C2.

The technical ideas that have been described in the aforementioned embodiment may be used in combination as appropriate, as long as there is no conflict.

Although the contents of the present invention have been specifically described with reference to a preferred embodiment, it is obvious that those skilled in the art can adopt various modifications based on the basic technical concept and teachings of the present invention.

For example, in signal processing device 300 shown in FIG. 1, switches 323B and 324B, i.e., the discharge circuit for capacitor C2 can be omitted.

In addition, in signal processing device 300 shown in FIG. 1, the discharge circuit for capacitor C2 using switches 323B and 324B, and the charge circuit for capacitor C2 using switch 324A can be omitted.

In this case, before sampling the sine wave signal SIN and before sampling the cosine wave signal COS, microcomputer 200 switches on switch 323A to apply a voltage of Vref/2 to capacitor C2 and charge capacitor C2.

In addition, in signal processing device 300A shown in FIG. 4, the charge and discharge circuit for capacitor C2 using switches 323A, 323B, 324A, and 324B can be omitted.

Although multiplexer 350 in FIG. 4 changes the input signal of low-pass filter circuit 310A, a multiplexer (signal selection circuit) can be provided that changes the input signal of switch 321A to either the output signal of low-pass filter circuit 310A or the supply voltage signal from the power supply in which the output voltage is set to ½ of the reference voltage Vref.

In addition, together with, or instead of, multiplexer 350 shown in FIG. 4, a multiplexer (signal selection circuit) that changes the input signal of low-pass filter circuit 310B to either the cosine wave signal COS or the supply voltage signal from the power supply of which the output voltage is set to ½ of the reference voltage Vref can be provided as a voltage application circuit.

Rotation angle sensor 110 is not limited to a sensor that outputs the sine wave signal SIN and cosine wave signal COS, or the device that outputs sinusoidal analog signals is limited to rotation angle sensor 110.

In addition, the signal processing device that processes the sine wave signal SIN and the cosine wave signal COS may include a sample-and-hold circuit for sampling and holding the sine wave signal SIN, and a sample-and-hold circuit for sampling and holding the cosine wave signal COS separately.

REFERENCE SYMBOL LIST

110 Rotation angle sensor
200 Microcomputer (control unit)
300 Signal processing device
310A, 310B Low-pass filter circuit (filter circuit)
320 Sample-and-hold circuit
321A, 321B Switch (first switch)
322 Power supply
323A, 324A Switch (second switch)
330 AD conversion circuit
400 Motor control device
C1 Capacitor (first capacitor)
C2 Capacitor (second capacitor)

The invention claimed is:

1. A signal processing device comprising:
a filter circuit including a first capacitor for reducing a predetermined frequency component of a sinusoidal analog signal;
a sample-and-hold circuit including a second capacitor for sampling and holding the sinusoidal analog signal that has passed through the filter circuit;
an AD conversion circuit for converting an output signal from the sample-and-hold circuit into a digital signal;
a voltage application circuit for applying a predetermined voltage to the second capacitor; and
a control unit for applying the predetermined voltage to the second capacitor through the voltage application circuit, thereby charging the second capacitor, and then causing the sample-and-hold circuit to sample the sinusoidal analog signal that has passed through the filter circuit, wherein
the predetermined voltage is ½ of the reference voltage of the AD conversion circuit.

2. The signal processing device according to claim 1, wherein the sinusoidal analog signal is a sine wave signal or a cosine wave signal output from a rotation angle sensor that detects the rotor angle of a motor.

3. A signal processing device comprising:
a filter circuit including a first capacitor for reducing a predetermined frequency component of an analog signal;
a sample-and-hold circuit including a second capacitor for sampling and holding the analog signal that has passed through the filter circuit;
an AD conversion circuit for converting an output signal from the sample-and-hold circuit into a digital signal;
a voltage application circuit for applying a predetermined voltage to the second capacitor; and
a control unit for applying the predetermined voltage to the second capacitor through the voltage application circuit, thereby charging the second capacitor, and then causing the sample-and-hold circuit to sample the analog signal that has passed through the filter circuit, wherein
the sample-and-hold circuit includes a first switch for switching between a sample mode and a hold mode, and
the voltage application circuit includes a second switch connected in parallel with the first switch, the second switch controlling electrical connection between a power supply whose output voltage is the predetermined voltage, and the second capacitor, and
the signal processing device further comprising a third switch on a line that connects the ground and a point between the first switch and the sample-and-hold circuit.

4. A signal processing device comprising:
a filter circuit including a first capacitor for reducing a predetermined frequency component of an analog signal;
a sample-and-hold circuit including a second capacitor for sampling and holding the analog signal that has passed through the filter circuit;
an AD conversion circuit for converting an output signal from the sample-and-hold circuit into a digital signal;
a voltage application circuit for applying a predetermined voltage to the second capacitor; and
a control unit for applying the predetermined voltage to the second capacitor through the voltage application circuit, thereby charging the second capacitor, and then causing the sample-and-hold circuit to sample the analog signal that has passed through the filter circuit, wherein
the sample-and-hold circuit includes a first switch for switching between a sample mode and a hold mode,
the voltage application circuit includes a second switch connected in parallel with the first switch, the second switch controlling electrical connection between a power supply whose output voltage is the predetermined voltage, and the second capacitor, the control unit switches the second switch to on from off to charge the second capacitor equivalent to the predetermined voltage, switches the second switch to off from on to cause a signal equivalent to the predetermined voltage to be output from the sample-and-hold circuit, switches the first switch to on from off to charge the second capacitor equivalent to the voltage of the analog signal, and switches the first switch to off from on to cause a signal equivalent to the voltage of the analog signal to be output from the sample-and-hold circuit.

* * * * *